US008782480B2

(12) United States Patent
Bansal

(10) Patent No.: US 8,782,480 B2
(45) Date of Patent: Jul. 15, 2014

(54) ON-CHIP FUNCTIONAL DEBUGGER AND A METHOD OF PROVIDING ON-CHIP FUNCTIONAL DEBUGGING

(71) Applicant: STMicroelectronics International N.V., Amsterdam (NL)

(72) Inventor: Parul Bansal, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/019,329

(22) Filed: Sep. 5, 2013

(65) Prior Publication Data
US 2014/0013177 A1  Jan. 9, 2014

Related U.S. Application Data

(63) Continuation of application No. 12/982,611, filed on Dec. 30, 2010, now Pat. No. 8,549,370.

(30) Foreign Application Priority Data

Dec. 30, 2009  (IN) .......................... 2742/DEL/2009

(51) Int. Cl.
G06F 11/00  (2006.01)
(52) U.S. Cl.
USPC .......................................... 714/733; 714/734

(58) Field of Classification Search
USPC ................................................. 714/733, 734
See application file for complete search history.

(56) References Cited

U.S. PATENT DOCUMENTS

| | | | |
|---|---|---|---|
| 5,862,148 A * | 1/1999 | Typaldos et al. | 714/724 |
| 6,427,232 B1 | 7/2002 | Ku et al. | |
| 6,732,311 B1 | 5/2004 | Fischer et al. | |
| 6,738,929 B2 * | 5/2004 | Swoboda et al. | 714/28 |
| 7,133,798 B1 * | 11/2006 | Ong | 702/117 |
| 7,519,879 B2 | 4/2009 | Woodward et al. | |
| 2002/0144235 A1 | 10/2002 | Simmers et al. | |
| 2003/0037225 A1 | 2/2003 | Deng et al. | |
| 2006/0041803 A1 | 2/2006 | Woodward et al. | |

* cited by examiner

Primary Examiner — Charles Ehne
(74) Attorney, Agent, or Firm — Wolf, Greenfield & Sacks, P.C.

(57) ABSTRACT

An on-chip functional debugger includes one or more functional blocks each providing one or more functional outputs. A hierarchical selection tree is formed by one or more selectors having the output of one of the selectors as a final output and individual selector inputs coupled either to a functional output from the functional blocks or to an output of another selector. A selection signal coupled to the select input of each of the selectors to enable a selected one of its output. An output node coupled to the final output. A method of providing on-chip functional debugging is also provided. A desired functional output from one or more available functional outputs is selected and then the selected functional output is coupled to an output node.

19 Claims, 5 Drawing Sheets

|                          | Columns Indices → |
|--------------------------|-------------------|
|                          | M-1  M-2  M-3  ...  1  0 |

| Row Indices | |
|---|---|
| 0 | Reset Signal Mapping |
| 1 | Functional Blocks Pin Multiplexing |
| 2 ... | Debugging Improvement |
| ... | ATPG Coverage Improvement / Unifed DfT Interface / Areas and Pin Count Reduction |
| $2^S-1$ | Reserved for Future |

FIG. 5

ON-CHIP FUNCTIONAL DEBUGGER AND A METHOD OF PROVIDING ON-CHIP FUNCTIONAL DEBUGGING

CROSS REFERENCE TO RELATED APPLICATIONS

This application is a continuation of U.S. application Ser. No. 12/982,611, filed Dec. 30, 2010, which application claims the priority benefit of Indian patent application number 2742/Del/2009, filed on Dec. 30, 2009, which applications are hereby incorporated by reference to the maximum extent allowable by law.

BACKGROUND OF THE INVENTION

1. Field of the Invention

The present disclosure relates to an on-chip functional debugger and a method of providing on-chip functional debugging.

2. Discussion of the Related Art

Validation of new chip designs involves a process of debugging of faults observed during various phases of testing. The debugging activity targets the identification of the causes of the fault or bug. Once a cause of defect is isolated, it is easy to replicate the problem on CAD (Computer-aided design) simulation environment and to resolve it. However poor visibility of internal nodes results in significant debugging time for complex problems. Owing to this limitation, silicon debugging remains an unsystematic process involving multiple variables.

Existing design methodologies do offer some debugging techniques. Some of the techniques are listed below:

JTAG (Joint Test Action Group) Interface. This interface is very slow and is therefore useful only for signals in KHz frequency domain.

Scan Chains are capable of debugging of manufacturing faults only.

E-beam Methodology. This is a complex and costly method and requires special facilities which are not easily available.

A specialized interface like Chipscope available only for FPGAs (Field-programmable gate array). It does not offer real time probing, is hardware intensive and the depth of signals probing is dependent on size of internal memory bank

SUMMARY OF THE INVENTION

In one embodiment, the on-chip functional debugger of the present disclosure comprises one or more functional blocks each providing one or more functional outputs. A hierarchical selection tree is formed by one or more selectors having the output of one of said selectors as a final output and individual selector inputs coupled either to a functional output from said functional blocks or to an output of another selector. A selection signal coupled to the select input of each of the selectors to enable a selected one of its output. An output node coupled to the final output. The final output is provided on a pad of the chip.

In another embodiment, the integrated circuit of the present disclosure comprises an on chip functional debugger. Said functional debugger comprises one or more functional blocks each providing one or more functional outputs. A hierarchical selection tree is formed by one or more selectors having the output of one of said selectors as a final output and individual selector inputs coupled either to a functional output from said functional blocks or to an output of another selector. A selection signal coupled to the select input of each of the selectors to enable a selected one of its output.

In another embodiment, the hierarchical selection tree is a single level tree comprising a single selector.

In another embodiment, the present disclosure provides a method of providing on-chip functional debugging. The output of each desired functional blocks is coupled to an input of a selector. The output of said selector is coupled to an output node. A selection signal is provided to said selector so as to enable a selected one of the functional block outputs to the output node.

In one embodiment of the present disclosure said selector is a multiplexer.

BRIEF DESCRIPTION OF THE DRAWINGS

The aforementioned aspects and other features of the present disclosure will be explained in the following description, taken in conjunction with the accompanying drawings, wherein:

FIG. 4(a) illustrates Sub-Blocks based IP level signal mapping according to the present disclosure.

FIG. 4(b) illustrates IP based SoC level global signal mapping according to the present disclosure.

FIG. 5 illustrates Objective based IP level signal mapping according to the present disclosure.

Figure 1:
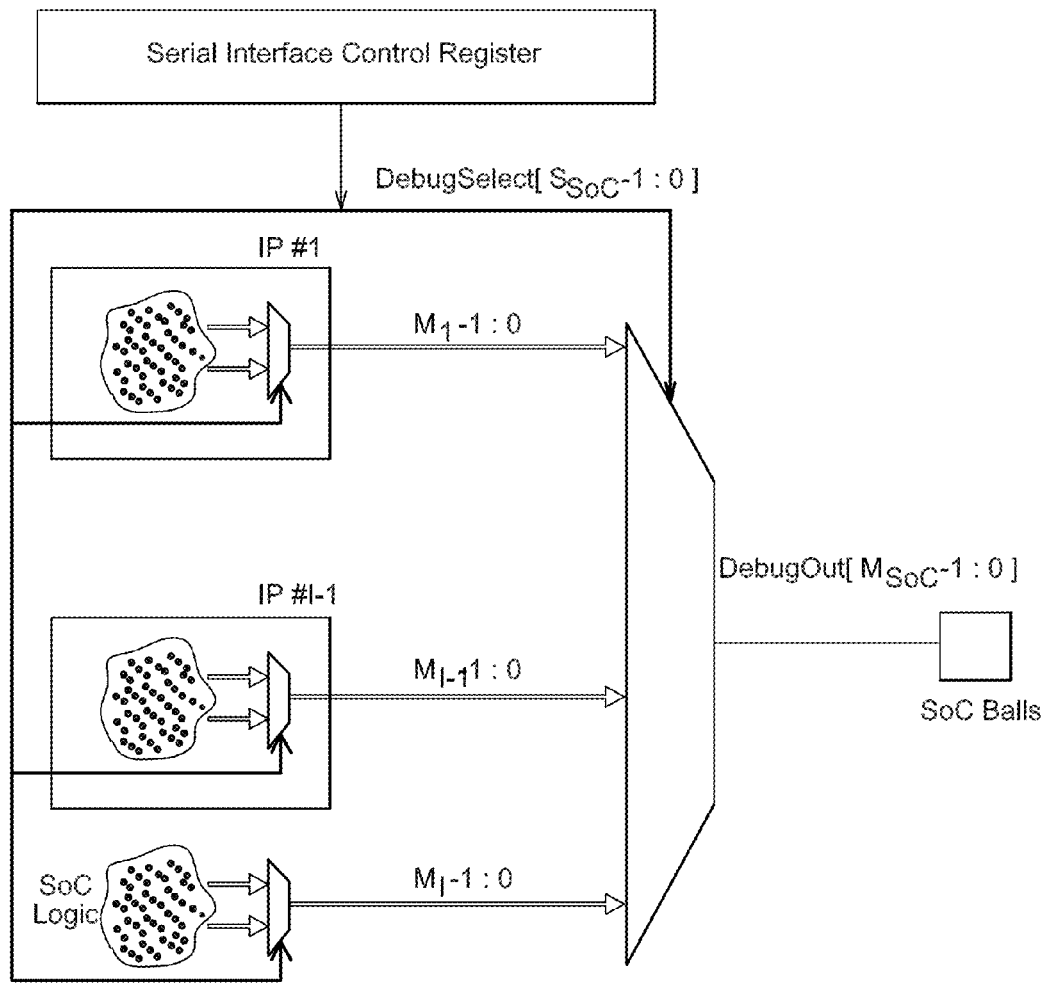
FIG. 1 illustrates an on-chip functional debugger according to the present disclosure.

While the disclosure will be described in conjunction with the illustrated embodiment, it will be understood that it is not intended to limit the disclosure to such embodiment. On the contrary, it is intended to cover all alternatives, modifications and equivalents as may be included within the spirit and scope of the disclosure as defined by the appended claims.

DETAILED DESCRIPTION

Embodiments of the present disclosure will now be described in detail with reference to the accompanying drawings. However, the present disclosure is not limited to the embodiments. The present disclosure can be modified in various forms. Thus, embodiments of the present disclosure are only provided to explain more clearly the present disclosure to the ordinarily skilled in the art of the present disclosure. In the accompanying drawings, like reference numerals are used to indicate like components.

The term "Data signal" and the term "selector" is defined for the purpose of this disclosure as follows:

Data Signal: A signal comprising one or more than one data bits grouped as a bus.

Selector: A device or arrangement of devices that receives multiple data signals each on separate input and provides one of these data signals as output based on the value of a selection signal.

Further the hierarchical selection tree is defined by determining the number, depth and width of the functional outputs, grouping of the functional outputs based on functional relationship between them and desired number of select lines.

The word "debug interface" and "on-chip functional debugger" are used interchangeably through out the specification. Similarly the word "multiplexer" and "selector" are used alternatively through out the specification.

FIG. 1 illustrates an on-chip functional debugger according to the present disclosure. The on-chip functional debugger of the present disclosure comprises one or more functional blocks each providing one or more functional outputs ($M_1$−1:0 ... $M_1$−1:0). A hierarchical selection tree is formed by one or more selectors having the output of one of said selectors as a final output [DebugOut(Msoc−1:0)] and individual selector inputs connected either to a functional output from the functional blocks or to an output of another selector. A selection signal connected to the select input of each of the selectors to enable a selected one of its output. An output node connected to the final output. The output node is a pad of the chip. The functional block output and the output node are of a defined data width.

Although it has not shown in the Figures, in one embodiment the inputs of each selector are coupled to an output of one or more selectors. In another embodiment inputs of each selector are coupled to a functional output from the functional blocks. In a further embodiment inputs of each selector are coupled to a functional output from the functional blocks and to an output of another selector. In a further embodiment inputs of each selector are coupled to a functional output from the functional blocks or to an output of another selector.

Even if the IP or SoC is functional in isolation, complex designs have higher chances of having functional faults in application mode because of:

an integration is done in some unforeseen manner; or
a surrounding logic is not generating the correct signals; or
latest technology models are "immature"; or
multi-voltage domain logic generates certain signals at incorrect voltage levels; or
a complex power saving state machine puts the design in an unknown state; or
there is a difference in analog block behavior with respect to its corresponding model; or
simulation test suite is not complete; or
all blocks are never co-simulated; or
system level hardware-software co-simulation is never performed;
ordigital verification environment has limitations to simulate analog behavior; or
power and noise integrity issues can't be simulated accurately.

It is almost impossible to simulate every design in all possible scenarios and thus it offers sufficient scope for passing functional issues to silicon. All these lead to the requirement and more importance of having systematic "post-silicon debugging" methodology.

The present disclosure addresses exactly this issue and discloses a debug interface to increase visibility for real time probing of important internal nodes. Said interface is fully scalable and easily implemented in all designs involving digital logic. Individual interfaces of all IPs can be flexibly integrated together with corresponding SoC interface during SoC integration.

The present disclosure provides a solution to the problem faced during functional mode debugging of testchips and SoCs.

The present disclosure provides a "real-time probing" interface. Apart from these techniques, there is no EDA tool focusing on silicon debugging. SoC designer provide some debugging options but a comprehensive, coherent and robust debugging scheme is never used at IP or SoC level.

The Interface of the present disclosure is very simple in design without complexity. The interface usage is very simple with no requirement of additional hardware or software. There are no design risks, no timing impact with full surety of operation even when there are no clocks, due to pure combinational nature. The Interface design is fully flexible across rows and columns.

The Interface of the present disclosure is a universal interface which is fully scalable across all IPs, SoCs and technologies with digital logic. said interface helps in improving the quality of design and reducing the maturity cycle. Said interface is highly productive due to multiple target objectives.

Figure 6:
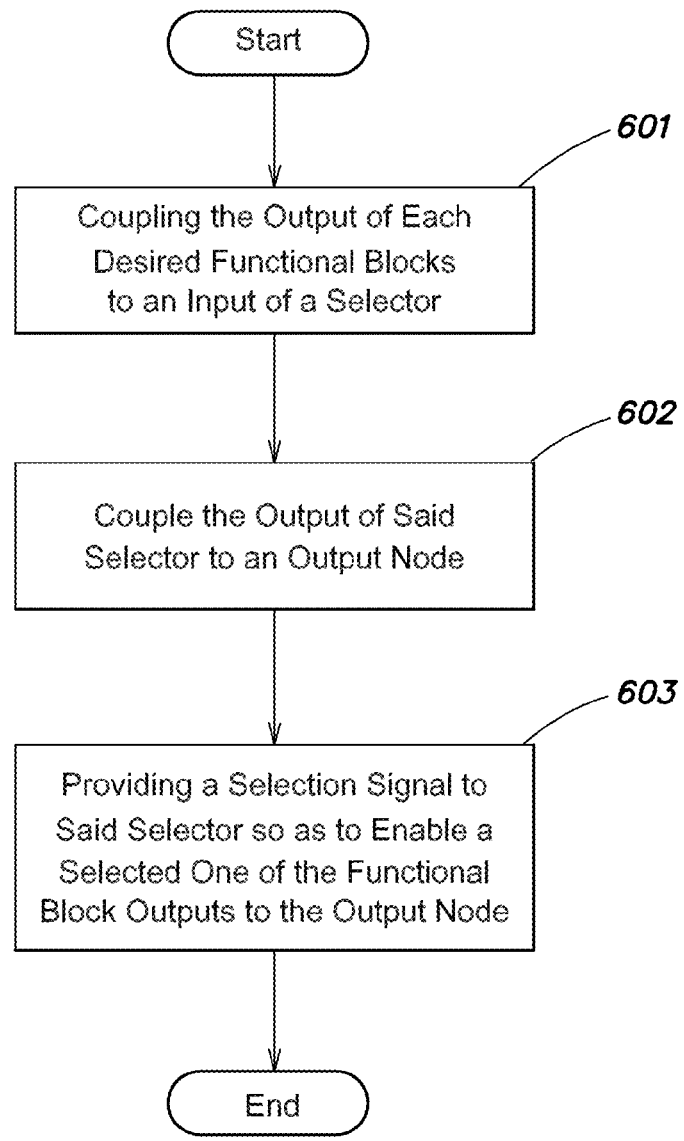
FIG. 6 depicts the method of providing on-chip functional debugging according to the present disclosure.

Embodiments of the method for functional fault debugging are described in FIG. 6. The methods are illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

In the method of providing on-chip functional debugging the output of each desired functional blocks to an input of a selector is coupled in step 601. In the next step 602 the output of the selector is coupled to an output node. A selection signal to said selector is provided so as to enable a selected one of the functional block outputs to the output node in step 603.

The method of the present disclosure is simple in implementation and is used on debugging system level components like design sub-blocks, IP integration, PCB components, testing setups and software issues.

In the step of selection of functional output, number of maximum number of signals to be mapped in an interface is determined. Then logically related signals based on the functional relationship of said signals are mapped.

Figure 2:
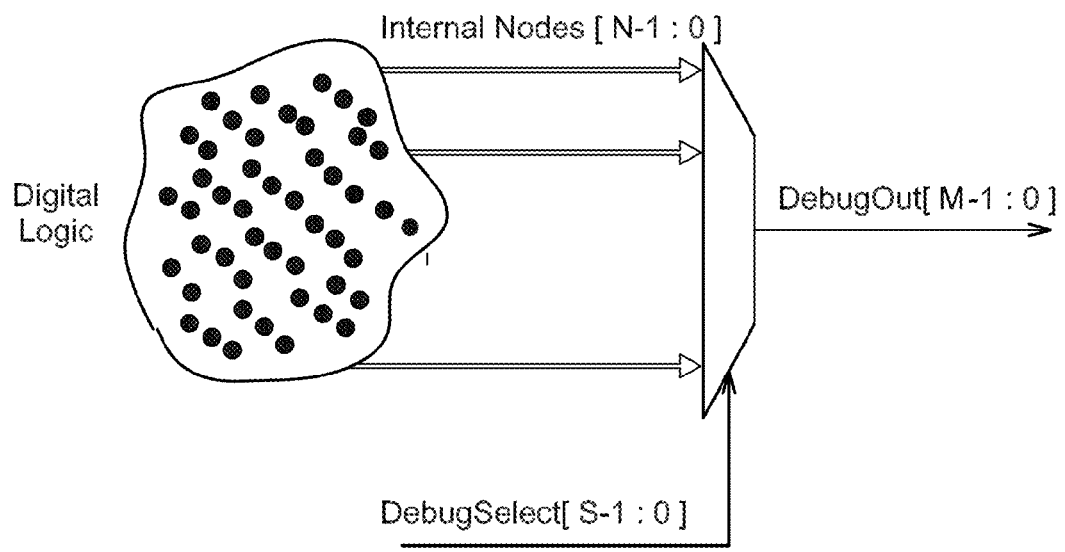
FIG. 2 illustrates an on-chip functional debugger according to an embodiment of the present disclosure.

IP level schematic view of the interface is shown in FIG. 2. The interface contains N inputs, M outputs (M<N) multiplexer with S select lines where N≤2^S*M. Important internal nodes are mapped to this interface during RTL (Register Transfer Level) design stage.

Figure 3:
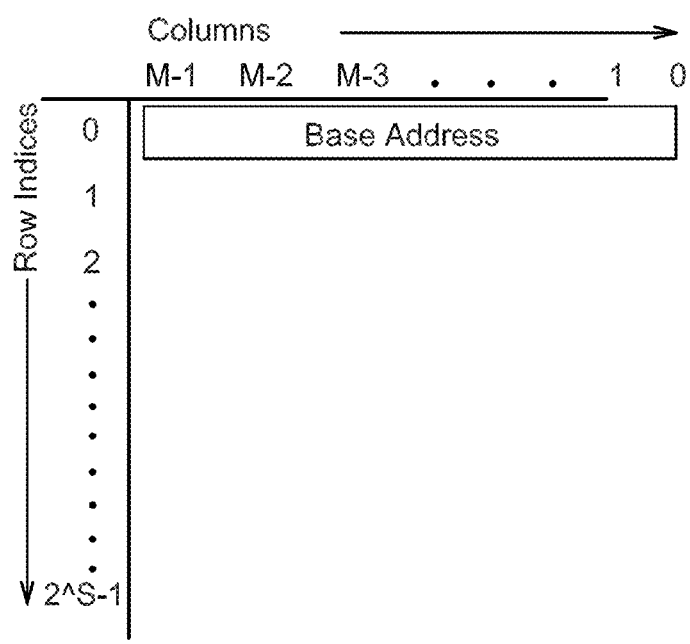
FIG. 3 illustrates address based signal mapping matrix according to an embodiment of the present disclosure.

FIG. 3 illustrates address based signal mapping matrix. The signals from internal nodes and multiplexer are selected and are clubbed together in an address based signal mapping table. Signal mapping table is considered as [2^S−1, M−1] matrix, where the row indices (0 to 2^S−1) should be considered as address and column indices (M−1 to 0) is considered as debug output ports. Zeroth row index should be considered as "base address". This will enable real-time viewing of N internal points, M of them in parallel.

Following are the method steps of functional fault debugging at IP level:

1. Determining Maximum Number of Signals to be Mapped in the IP

The number of parallel debug outputs (M) and number of input select lines (S) are determined. This will determine the maximum number of signals which can be mapped ($N_{Max}$). The values of M and S are fully flexible and can vary depending on the individual design needs. However it is recommended to have M=2^x, where x is any integer, for efficient SoC mapping.

2. Selection of Internal Signals

Selection of internal signals is performed based on the importance of information carried by those signals.

3. Grouping of Signals

Figures 4A, 4B:
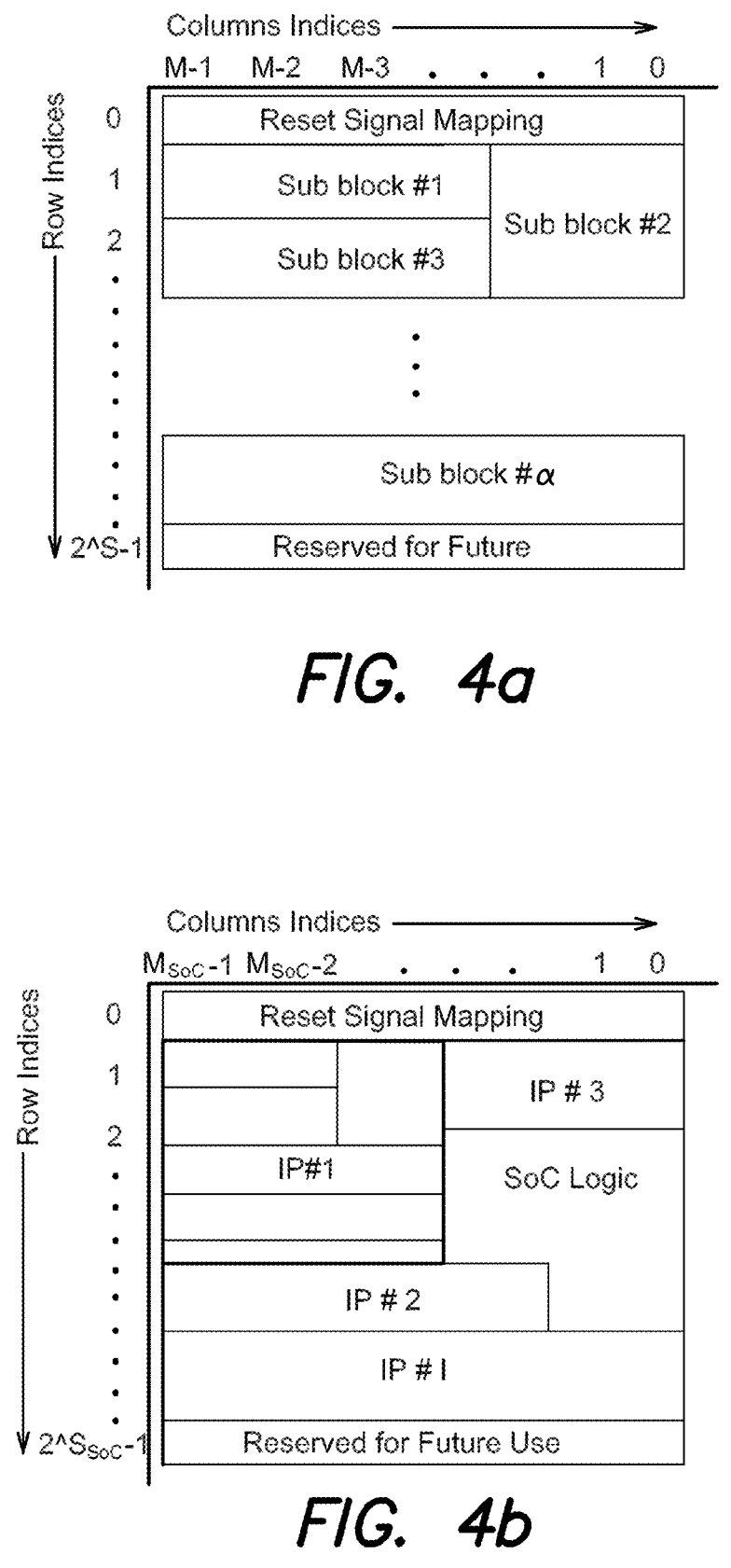

Logically related signals are grouped together based on their functional relationship as shown in FIG. 4a. As only M outputs can be viewed in parallel, it is very important to clearly map the selected signals. Special consideration is taken for signal mapping on base address. It is recommended to map internal reset signals on this address for the reason explained later on. Some address locations can also be left for future expansion.

SoC integration of individual IP debug interface is simple and is very similar to the method steps of functional fault debugging at IP level as explained above. Following are the key design steps at SoC level:

1. Determining Maximum Number of Signals to be Mapped in the SoC

Individual IP debug interface, number of SoC logic signals and SoC pin constraints are considered to determine number of parallel debug outputs ($M_{SoC}$) and number of input select lines ($S_{SoC}$).

To simplify the calculations, lets assume that M[i], where i is the IP number integrated inside SoC, and $M_{SoC}$, are equal to $2^x$ (x is any integer number), the calculation for $S_{SoC}$ is:

$$A = \text{Log}_2 \left\{ \frac{\left( \sum_{i=1}^{I} 2^{\wedge}S[i] * M[i] \right)}{M_{SOC}} \right\}$$

$$S_{SoC} = \text{Ceiling } [A]$$

1. Selection of SoC Signals

Signals are selected from SoC logic and mapped to debug interface. Similar to IP signal selection, SoC signal selection is based on signal importance.

2. Grouping of Signals

All individual IP signal matrices are easily mapped to unified SoC signal matrix as explained in FIG. 4(b). Additionally SoC signals should also be grouped together at various available addresses. Similar to the recommendation for IP's signal matrix, SoC signal matrix's base address should contain SoC reset signals. Some address locations can also be left for future expansion.

3. Select Line Control is Explained in FIG. 1.

Select line for all debug interfaces are controlled either from SoC pins or from any serial test interface like JTAG control bits. It is recommended to use register control bits to reduce pin requirement. If controlled through register bits, global reset will also reset these controlled bits to default value (All 0's) thus selecting base address. This is the reason for mapping internal reset signals at base address.

Signal mapping can be performed in two different ways, which are as follows:

1. Blocks Based Signal Mapping

Signals can be mapped based upon related blocks both at IP or SoC level. For example digital block 1 or digital block 2 related signals, or Analog block 1 or analog block 2 related signals can be clubbed together at IP level as shown in FIG. 4(a).

Similar to IP signal matrix, SoC signal matrix can be designed by allocating various IP mapping table to different address locations. IP matrices with different depth and width can be easily combined in SoC signal matrix as shown in FIG. 4(b).

2. Objective Based Signal Mapping is Explained in FIG. 5.

Besides the prime objective of providing increased signal visibility, this interface can be extended to serve other objectives like:

a. Functional Block Pin Multiplexing

The interface can also be used to pin multiplex functional blocks which are operational only one at a time.

b. ATPG (Automatic Test Pattern Generator) Coverage Improvement

Uncovered fault points after ATPG analysis can be mapped to this interface to increase coverage. This is extremely useful for timing critical digital-analog interface signals where scan collar-flop insertion is not recommended.

c. Unified DfT (Design for Test) Interface

The interface can be used to map various DfT signals of an IP. These signals could be status signals like BISTOK, digital outputs from different analog blocks or any digital signal which requires observation. Thus DfT strategy can use a single unified interface for many DfT needs.

d. Area and Pin Reduction

Logic can be optimized by selectively mapping certain signals so that hardware resources like SoC balls, IO pads, level shifters etc can be reused resulting in area and pin reduction.

Although the disclosure of system and method has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

I claim:

1. A functional debugger configured to identify a functional fault of a functional block, the functional debugger comprising:
    a selector switchably connected between a pin of an integrated circuit and two or more nodes internal to the functional block, the selector being configured to select from among the two or more internal nodes and to provide a signal from the selected internal node to the pin of the integrated circuit,
    wherein the functional debugger and the functional block are integrated in the integrated circuit,
    wherein the selector comprises a plurality of selection circuits including first, second, and third selection circuits, and
    wherein an input of the first selection circuit is coupled to a first of the two or more internal nodes, an input of the second selection circuit is coupled to a second of the two or more internal nodes, outputs of the first and second selection circuits are coupled to respective inputs of the third selection circuit, and an output of the third selection circuit is coupled to the pin of the integrated circuit.

2. The functional debugger of claim 1, wherein the plurality of selection circuits comprise one or more multiplexers.

3. The functional debugger of claim 1, wherein the selection circuits are organized in a hierarchical selection tree, the hierarchical selection tree having inputs connected to the two internal nodes of the functional block and having an output connected to the pin of the integrated circuit.

4. The functional debugger of claim 1, wherein the selector has one or more selection inputs configured to receive one or more respective selection signals, wherein the selector is configured to select from among the two or more internal nodes based on the one or more selection signals, and wherein the one or more selection signals are provided by a register, the register being integrated in the integrated circuit.

5. The functional debugger of claim 4, wherein the two or more internal nodes include a reset node configured to provide an internal reset signal of the functional block, and wherein the selector is configured to provide the internal reset signal to the pin of the integrated circuit when a value of the register is reset to a default value.

6. The functional debugger of claim 5, wherein the default value of the register is 0.

7. The functional debugger of claim 1, wherein the selector consists of combinational logic.

8. The functional debugger of claim 1, wherein the selector is an asynchronous circuit.

9. A method comprising:
   obtaining a first signal at a pin of an integrated circuit by selecting a first internal node from two or more nodes internal to a functional block, the functional block being integrated in the integrated circuit, the first signal being from the first internal node;
   obtaining a second signal at the pin of the integrated circuit by selecting a second internal node from the two or more nodes internal to the functional block, the second signal being from the second internal node; and
   identifying a functional fault of the functional block based on the first signal from the first internal node of the functional block and/or the second signal from the second internal node of the functional block,
   wherein the first signal is an internal reset signal, and wherein obtaining the first signal at the pin of the integrated circuit by selecting the first internal node comprises obtaining the internal reset signal at the pin of the integrated circuit by resetting a value of a register to a default value.

10. The method of claim 9, wherein the selecting of the first and second internal nodes is performed with a selector, and wherein the selector is integrated in the integrated circuit.

11. The method of claim 9, wherein:
   the register is integrated in the integrated circuit, and
   selecting the second internal node comprises storing a second value in the register.

12. A functional debugger configured to identify a functional fault of a functional block, the functional debugger comprising:
   a selector switchably connected between a pin of an integrated circuit and two or more nodes internal to the functional block, the selector being configured to select from among the two or more internal nodes and to provide a signal from the selected internal node to the pin of the integrated circuit,
   wherein the functional debugger and the functional block are integrated in the integrated circuit,
   wherein the selector is configured to select from between the two or more internal nodes based on a value of a register,
   wherein the two or more internal nodes include a reset node corresponding to an internal reset signal of the functional block, and
   wherein the selector is configured to provide the internal reset signal to the pin of the integrated circuit when the value of the register is reset to a default value.

13. The functional debugger of claim 12, wherein the selector comprises a plurality of selection circuits including first, second, and third selection circuits, and
   wherein an input of the first selection circuit is coupled to a first of the two or more internal nodes, an input of the second selection circuit is coupled to a second of the two or more internal nodes, outputs of the first and second selection circuits are coupled to respective inputs of the third selection circuit, and an output of the third selection circuit is coupled to the pin of the integrated circuit.

14. The functional debugger of claim 12, wherein the selection circuits are organized in a hierarchical selection tree, the hierarchical selection tree having inputs connected to the two or more internal nodes of the functional block and having an output connected to the pin of the integrated circuit.

15. The functional debugger of claim 12, wherein the plurality of selection circuits comprises one or more multiplexers.

16. The functional debugger of claim 12, wherein the selector has one or more selection inputs configured to receive one or more respective selection signals, wherein the selector is configured to select between the two or more internal nodes based on the one or more selection signals, and wherein the one or more selection signals are provided by the register, the register being integrated in the integrated circuit.

17. The functional debugger of claim 12, wherein the selector consists of combinational logic.

18. The functional debugger of claim 12, wherein the selector is an asynchronous circuit.

19. The functional debugger of claim 12, wherein the default value of the register is 0.

* * * * *